(12) United States Patent  
Bidenbach et al.

(10) Patent No.: US 7,761,756 B2
(45) Date of Patent: Jul. 20, 2010

(54) CIRCUIT CONFIGURATION WITH SERIAL TEST INTERFACE OR SERIAL TEST OPERATING-MODE PROCEDURE

(75) Inventors: Reiner Bidenbach, Vörstetten (DE); Joerg Franke, Freiburg (DE); Joachim Ritter, Lörrach (DE); Christian Jung, Simonswald (DE)

(73) Assignee: Micronas GmbH, Freiburg (DE)

( * ) Notice: Subject to any disclaimer, the term of this patent is extended or adjusted under 35 U.S.C. 154(b) by 260 days.

(21) Appl. No.: 11/803,853

(22) Filed: May 15, 2007

(65) Prior Publication Data

US 2007/0294605 A1  Dec. 20, 2007

(30) Foreign Application Priority Data

May 15, 2006  (DE) .................. 10 2006 022 985

(51) Int. Cl.
   *G01R 31/28* (2006.01)
(52) U.S. Cl. .................................................. 714/724
(58) Field of Classification Search ............. 714/724, 714/745
   See application file for complete search history.

(56) References Cited

U.S. PATENT DOCUMENTS 6,005,477 A * 12/1999 Deck et al. .................. 370/482
6,292,009 B1    9/2001 Farnworth et al.
7,015,702 B2 *  3/2006 Rupp ......................... 324/607
7,170,394 B2 *  1/2007 Chandler et al. ........ 340/310.11
7,321,482 B2 *  1/2008 Josephson et al. ............. 361/56
7,433,793 B2 * 10/2008 Mori ......................... 702/117

FOREIGN PATENT DOCUMENTS

| DE | 198 19 265 C1 | 8/1999 |
| DE | 19819265 C1 | 8/1999 |
| DE | 199 12 446 C1 | 11/2000 |
| DE | 101 02 871 A1 | 2/2002 |
| DE | 102004010852 A1 | 11/2005 |
| EP | 0084247 A2 | 7/1983 |
| EP | 0 245 591 A2 | 11/1987 |
| EP | 0687916 A2 | 12/1995 |

* cited by examiner

*Primary Examiner*—James C Kerveros
(74) *Attorney, Agent, or Firm*—Maginot, Moore & Beck

(57) ABSTRACT

The invention relates to a circuit configuration with a serial test interface (TIF) to control a test operation mode, a freely programmable digital processor (CPU), a housing (G) for the accommodation of a test interface (TIF) and the processor (CPU) with terminals or connectors (C0, C1) for data and/or signal exchange with external components and setups. At one of the terminals (C1), a modulated supply voltage (VDD) can be received the transfer of data (d) and or a clock (T) by using at least two voltage levels (V2, V3) that can be controlled and which are different from a supply voltage level (V1) that is designed to feed the circuitry with a supply operating voltage. Furthermore, the invention relates to a serial test operation method for such a circuit configuration.

13 Claims, 3 Drawing Sheets

Figure 1:
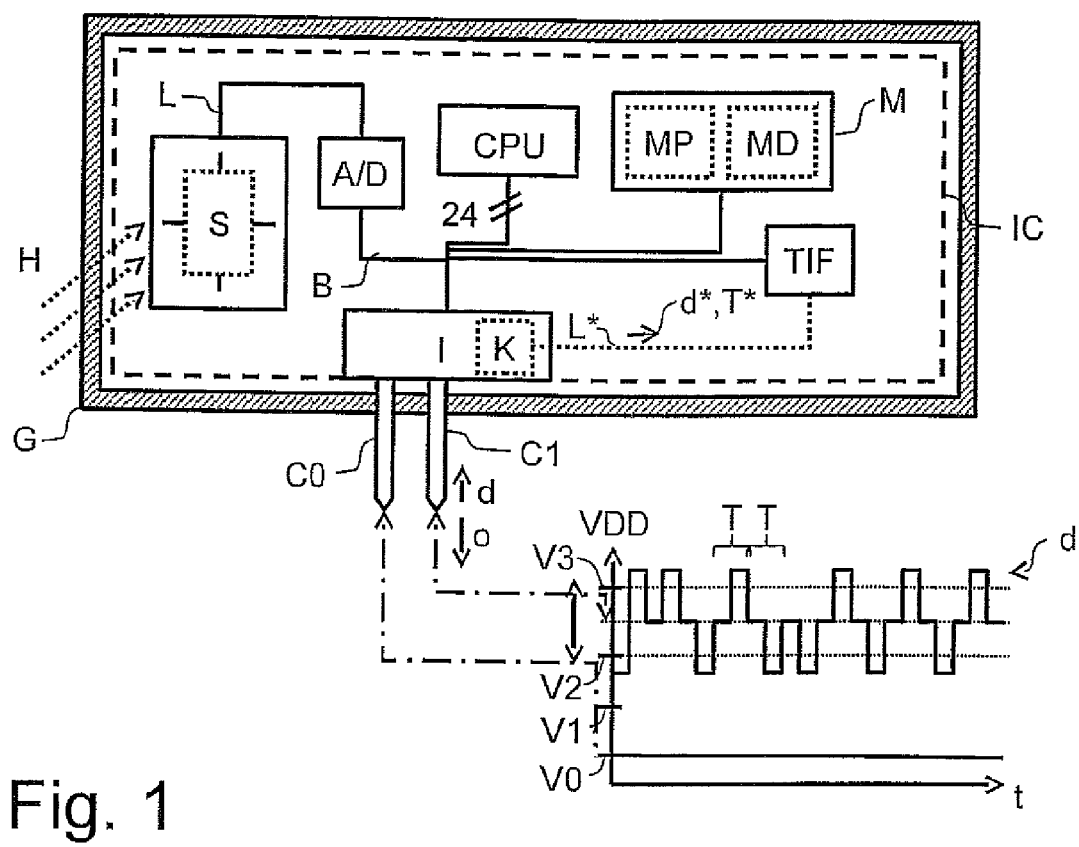

CIRCUIT CONFIGURATION WITH SERIAL TEST INTERFACE OR SERIAL TEST OPERATING-MODE PROCEDURE

The invention relates to a circuit configuration with a serial test interface with features according to the preamble of claim 1, or a serial test operating-mode for the operation especially of such a test interface.

DE 198 19 265 C1 describes a method for the parameterization of an integrated circuit arrangement and an integrated circuit arrangement for this purpose. Starting point is an integrated circuit arrangement that features components with essentially fixed wiring or fixed connections. The parameters for the circuit arrangement can be specified using a parameterization operation. A supply voltage terminal to which a supply voltage is connected is used for parameter input. To this end, the actual parameter data is modulated onto the supply voltage, whereupon a comparator connected downstream to the supply voltage terminal tests the applied supply voltage in order to determine whether this voltage rises above a threshold value. The threshold value is in this case a single level greater than the normally required supply voltage of the integrated circuit arrangement. In addition, the integrated circuit arrangement includes, according to specific embodiments, a Hall sensor that is used to detect a magnetic field that influences the integrated circuit arrangement. The data obtained by the sensor is output via an analog output terminal.

Further, housings with a large multitude of terminals in form of so-called pins are generally known, which are used for the accommodation of, among other things, integrated circuit components. It is known that a freely programmable digital processor and other components can be contained in a housing. Usually, two terminals of the housing are thus used to connect to a supply voltage and a base voltage, two other terminals are used to connect to ground or zero voltage and an operating voltage, and numerous additional terminals are used for input and output of data.

Circuit configurations of this kind and also any other integrated circuit configurations use for testing and verification either only signal terminals fed from an appropriate housing for parallel or serial testing or use, if only a few connectors are available, a simple single-level modulation of the supply voltage according to DE 198 19 265 C1 and/or a simple modulation of the power intake.

So far, in order to be able to execute a fast unidirectional serial and synchronized test of an integrated circuit configuration, at least three input terminals, as well as a minimum of one output terminal, have been necessary. The input terminals are employed to provide an operation-mode signal for signaling of a test operation mode, a clock signal and a general input signal. The output terminal allows for modulation of the current intake. One of the input terminals may be eliminated using a single-level modulation of the supply voltage for whose demodulation a comparator is arranged in the integrated circuit configuration. A parallelization of permanent operating procedures is made possible by providing additional input and output terminals.

There exist several options for reducing the number of terminals which are provided for connections of the circuitry within any particular housing. According to a first option, the availability of a special testing operation mode is abandoned, which will enable only testing during applications. According to a second option, a test operation mode may be activated by providing a special serial password received in an input connection after switching on or sequential power-up and stored in a register cell. However, this procedure is quite unsafe, since any special password may also occur in the ever present signal noise. This could lead to an unintentional change of the integrated circuit configuration into test operation mode during an application. According to a third option, an input terminal could be omitted by working with an internal clock instead of an externally generated clock. But such a modification allows only for a synchronized, and therefore slow, data transfer, which is not supported by standard production testers. According to a fourth possibility, the output terminal may be used as a bidirectional input and output terminal. This would mean, however, that neither a modulation of the supply voltage nor a modulation of the input current can be carried out bidirectionally; and furthermore that a bidirectional transfer vs. a unidirectional transfer will always lead to a limitation of the maximum possible transfer frequency.

An object of the invention is to propose a circuit configuration with a serial test interface and a method for serial test operation, respectively, which is usable even with integrated circuit configurations with a reduced number of terminals without loss of possible functionality or capacity.

This object is achieved by the circuit configuration with a serial test interface with features according to patent claim 1 or with a method for serial test operation with the features according to patent claim 9. Advantageous designs are subject of dependent claims.

In accordance with a first embodiment, a circuit configuration includes a serial test interface to trigger a test operation mode, a freely programmable digital processor, a housing for accommodating the test interface and the processor, and with terminals for data and/or signal exchange with external components and devices in which at one of the terminals, a modulated supply voltage can be applied for the transfer of data and/or a clock by using at least two voltage levels that are controllable and that are different from a supply voltage level that is used to feed the circuitry with a supply voltage.

With the aid of at least two comparators the overshoot and/or undershoot of the two voltage levels may already be detected.

With the aid of a comparator circuit, both the supply voltage modulated data or the circuit configuration internal data and the supply voltage modulated clock or the circuitry internal clock may be extracted advantageously. The internal clock is thereby is advantageously used by the circuitry configuration, or components of the circuit configuration in the test operation mode. This facilitates a synchronized transfer of external data for programming and/or storing purposes without the synchronizing of the external data having to be done on an internal clock of the circuit configuration.

A switching circuit is advantageous for the activation of a comparator circuitry and/or the test interface in a single test operation mode. This facilitates a distinct reduction of power usage in a normal operation mode of the circuit configuration, since power intensive components, which are not needed for normal operation, may be disconnected from the power supply.

Preferably, a memory element is provided for the storage of basic states for automatic activation of test operation modes after switching on and/or start-up of the circuit configuration. A deactivation of the circuit configuration, for example, in the case of a power outage or an exchange of such components will lead to the activation of the test operation mode running after an installation or a new startup in each case in order to test the circuitry or its components and/or in order to program the circuit configuration with new functionalities.

An analog or digital sensor, for example a Hall-sensor, may be integrated to establish a sensor circuit configuration.

An embodiment of a method for serial test operation of such a circuit configuration has been found to be advantageous wherein in accordance with the method external data as well as an external clock are modulated onto the supply voltage for transfer into the circuit configuration.

To modulate the data and the clock, two special additional voltage levels may be used in addition to a supply voltage level that provides the operating voltage of the circuit configuration. The data and the clock can be modulated onto the supply voltage in such a manner that with each second slope of a cycling period of a clock pulse, one of the two voltage levels are either exceeded, or not reached, whereas the clock slopes in between take the supply voltage to a level between the two voltage levels.

A predetermined bit sequence may be used advantageously in signaling an activation of a test operation mode.

Components of the circuit configuration may easily be tested and/or reprogrammed using the transferred data.

By implementing just one additional voltage level, more specifically a second voltage level above a supply voltage, the functions of a clock transfer and a data input operation can be reduced to one input terminal. In this way, a fast unidirectional serial and synchronized test operation mode is realizable by which a data output can be realized with a specified output terminal or with a current intake modulation.

Algorithms and/or parameters for such a test operating-mode can be stored—also via a reset or a reduction of power—in an internal non-volatile memory such as an EEPROM or an NV-RAM, which consists of an EEPROM and a register or a RAM.

In order to switch to the test operation mode directly after the first power-up, that is after the wafer completion or temperature storage, the content of preferably just two non-volatile cells can be compared. A test operation mode is only activated if the contents of both cells are the same, for example, if the contents of both cells show a value of 0. For further parallelization of a test, additional levels pertaining to supply voltage or a power input option may be added.

The following is a more detailed description of an exemplary embodiment according to the drawings.

Figure 2:
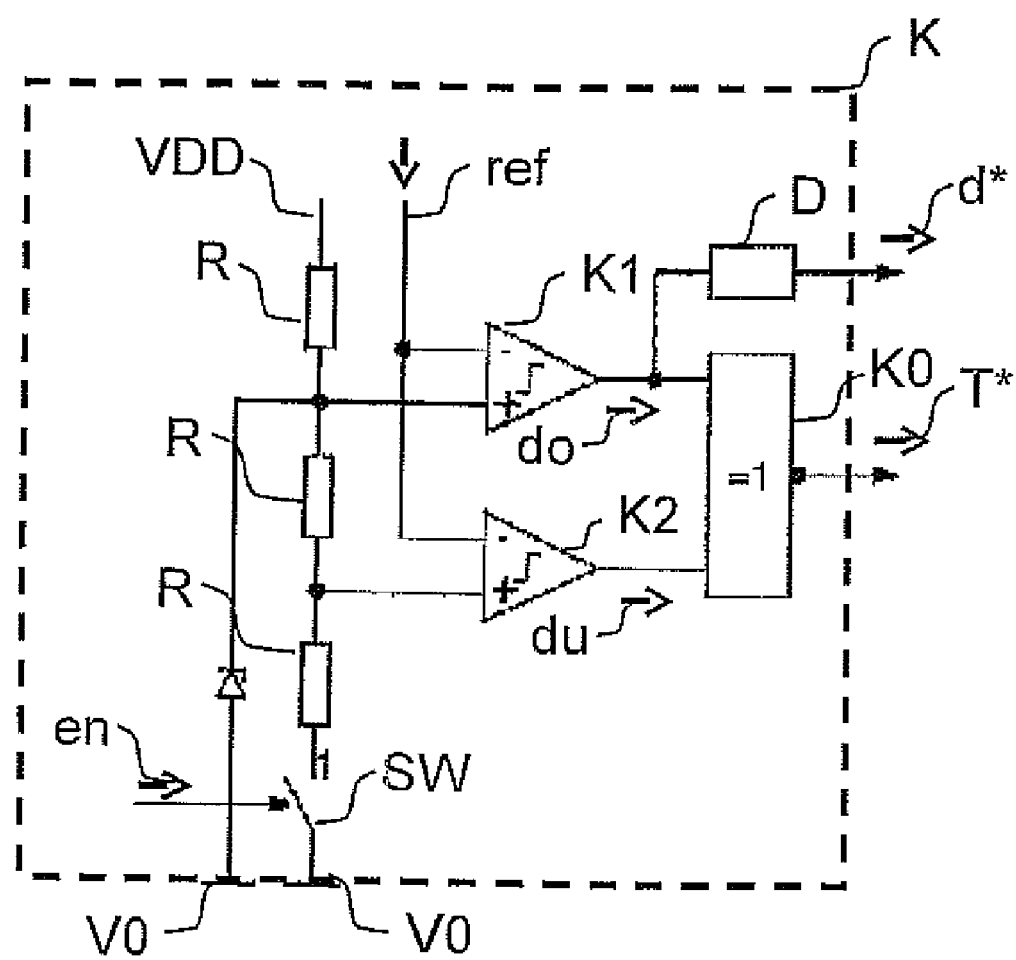
Figure 3:
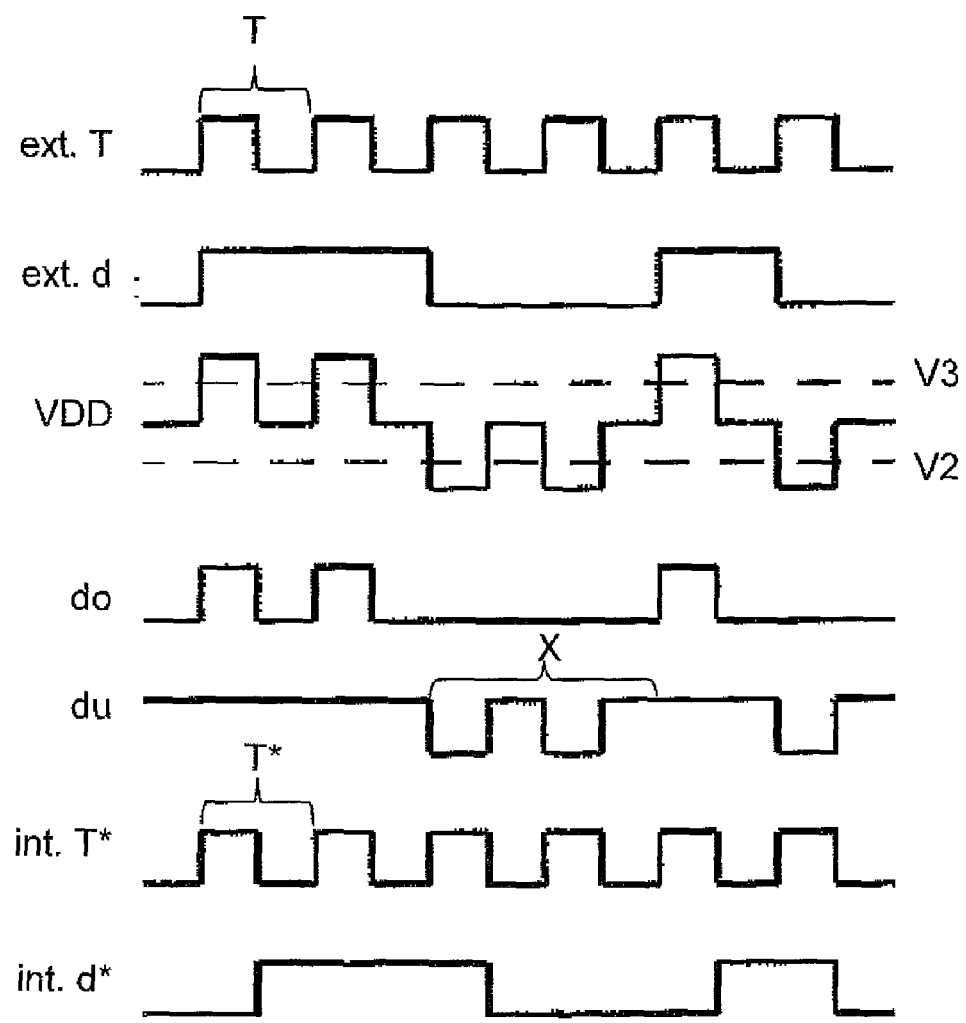

FIG. 1 shows a schematic sectional view of a housing with an integrated circuit configuration; and FIG. 2 shows an exemplary circuitry for a comparator for the extraction of data and a clock from an applied supply voltage and FIG. 3 shows various signal or pulse schemes for the clarification of a modulation or demodulation procedure of a supply voltage.

FIG. 1 shows a schematic sectional view of a housing G of a monolithic sensor; the monolithically integrated components inside the housing are shown only in schematic block diagram format. The actual implementation of such an integrated circuit configuration IC as contained in housing G may be designed as is usual and customary for integrated circuit configurations. Besides the components shown, additional components can be integrated into the circuit configuration which may be advantageous or necessary for the usual operation of this monolithic sensor.

The pictured housing G shows two terminals or connectors C0, C1 for the connection of components located inside housing G. The connectors C0, C1 are preferably configured as well-known so called pins, which may be received by a receptacle. The connectors C0, C1 run within the housing G to an interface switch I. The interface switch I converts signals or data from the connectors C0, C1 to an internal bus B or in the opposite direction data from the integrated bus B to one or both of the connector contacts C0, C1. The bus B should preferably be a parallel bus, equipped for instance as an 8-bit data bus and a 16-bit address bus. Instead of a 24-bit bus for both address and data transfer, separate busses may suitably be built into the integrated circuit configuration IC. Bus B is used to connect the various components built into the integrated circuit configuration C.

A preferred component constitutes a sensor S, specifically shown is an exemplary particularly preferred control-sensor in the form of a monolithic sensor that is influenced by magnetic fields H. In order to provide the analog signal of such an analog sensor S in digital form for the processing by additional components, the sensor S is connected via a line L to an analog/digital converter, which transfers the digital data directly to a processor CPU or via the bus B to the processor CPU or to additional components.

The processor CPU is a freely programmable digital processor and constitutes another feature of the monolithic sensor. In order to operate such a freely programmable digital processor CPU, the processor CPU is connected via bus B to additional components customary and necessary for its operation. To this end, a data memory MD and a program memory MP have been implemented in the integrated circuit configuration. In an exemplary embodiment, the data memory MD and the program memory MP are combined into a single memory configuration M; but it is also possible to design them as individual memory devices. Apart from the possibility to connect the memory M via the bus B to the processor CPU, additionally or alternatively the processor CPU may be configured as a processor core with directly attached memory capacity.

For the operation of the illustrated embodiment of the integrated circuit configuration IC, a supply voltage VDD needs to be applied to it. To this end, the first terminal C0 of the terminals C0, C1 may suitably be supplied with a basic voltage of V0 and the second terminal C1 is connected to the supply voltage VDD. Since the two terminals C0, C1 are also used for data transfer, the data is modulated onto the connected supply voltage VDD.

In the exemplary embodiment described herein, the connected supply voltage VDD is modulated over the course of time t according to the voltage-time diagram shown in FIG. 1. For example, it is assumed that a first supply voltage level V1 is required as supply voltage for the integrated circuit configuration IC. The modulation of data is done by setting up a varying supply voltage VDD with a higher voltage level than the first supply voltage level V1 in order to transmit the data. Especially preferred is the implementation of two or possibly more higher voltage levels V2, V3 into an appropriate protocol, so that not only pure data but preferably also a clock pulse P can be transferred via the supply voltage VDD. The interface circuit I thereby preferably carries out a transformation from a serial data signal to a parallel data signal, or an opposite transformation from parallel data to serial data for output of the data measured by sensor S or other data. The interface switch I is preferably equipped with a comparator switch K in order to be able to analyze the voltage levels, i.e. to be able to determine the data d transferred via the supply voltage VDD.

The embodiment of the integrated circuit IC of FIG. 1 furthermore includes specifically the comparator circuit K and a test function interface TIF or test interface circuit. The comparator circuit K and the test interface TIF may be advantageously be integrated into the interface circuit I or connected directly to the interface switch I via direct coupling L* or via a bus of their own.

FIG. 2 shows an exemplary embodiment of a circuit configuration for the comparator circuit K. Specifically, the basis voltage V0 and the supply voltage VDD with varying levels, which can be obtained directly at the interface switches I and/or by the two connectors C0, C1, are applied. Especially a diode shown in the diagram is an optional element and can be left out.

A resistor chain with three resistors R are connected in series, a first resistor of which is connected between the supply voltage VDD and the base voltage V0. A first comparator K1 includes two inputs, whereby the base voltage V0 is connected with a positive input and a negative input with a reference voltage ref. For instance, the reference voltage ref can be an internal voltage value, which is at a midrange voltage level located between the second and the third voltage levels V2, V3. The reference signal ref can preferably be an internally generated voltage having a Bandcap for temperature and voltage.

A second comparator K2 also includes two inputs, where the negative input is switched to the reference voltage ref. The positive input is coupled to resistor R at a node between second and third resistors R from the perspective of the supply voltage VDD. The outputs of the first and second comparators K1, K2, are connected to an extraction device configured to extract the original clock T and prepare an associated special internal pulse T*.

Furthermore, the output of the first comparator is provided to a delay element D, which presents the reconstructed original data d as internal data d* with a time delay. The delay element D is configured such that the slopes of the signals for the internal data d* do not coincide with the slopes of the internal pulse T*.

The third resistor of the resistors R may suitably be switchably connected to the basis voltage V0 via a switch SW, wherein the closing of the switch is controlled by an enable signal en, which is employed for activating the test operation mode. In order to reduce power consumption, the comparators K1, K2 can be switched off by deactivation if the integrated circuit IC is not currently in the test operation mode.

The test operation mode is activated preferably if a certain bit sequence is present in a predetermined register area, especially in two EEPROM-cells, or if an appropriate bit sequence is received with the transferred data d, d*. The preferred data sequence consists of two bits set to zero.

FIG. 3 shows exemplary pulse diagrams for various signals in such a circuit configuration. The first line shows the external clock T, which is modulated to the supply voltage VDD. The second line shows the external data d, which is modulated to the supply voltage VDD. The third line shows the supply voltage VDD modulated with the external data d and the external clock T. The modulation is performed in such a way that with each second pulse slope of the clock pulse T, meaning with each clock pulse segment, either the second voltage level V2 is undershot for a half clock pulse or the third voltage level V3 exceeded for a half a clock pulse. With the appropriate combination logic the suitable voltage levels V2, V3 run with passages overshooting or undershooting the supply voltage VDD according to the signal course of the signal for the external data d.

After the transmission to the comparator circuit K, the signal do of the fourth line is available at the output of the first comparator K1, which will always have a high state when the external data d has a high data state. The fifth line shows the signal course du at the output of the second comparator K2, which will always have a low state when the external data d is at a low state. From this output signal do, du of the two comparators K1, K2 the internal pulse T* and the internal data d* are reconstructed and prepared for further switching components, especially for the test interface TIF.

The signal sequence for the activation of the test operation mode can therefore be deduced from the voltage values of the supply voltage VDD that are attached to the two connector contacts C0, C1 according to an execution procedure additionally or alternately after a resting period or voltage outage. In case of an initial startup, the test operation mode is automatically activated by the preset register values that are all set to 0.

The signal level of the internal pulse T* and the internal data d* for the deactivated state are pre-defined in order to be able to shut off the comparator switch K by deactivating the enable signal en, so that preferably the total operation of this switching segment may be reduced to zero. This way, the processor CPU starts the operation after switch on of the power in the test operation mode. The serial test interface TIF can switch to the reset state and then modify the internal control registers, for instance deactivate the processor CPU, before the reset state is left again. The processor CPU preferably keeps running when a switching from the user operation mode to the test operation mode is being executed, until the serial test interface TIF produces a reset signal. The process described for modulation of the supply voltage VDD originated by a command in the form of corresponding data bits, transmitted by the supply voltage VDD is effective only after the fourth bit has been received.

FIG. 1 shows an embodiment in which output data o are provided via the connector C1 of the two connectors, for instance by current modulation. According to alternative versions, three or more connectors or terminals can be implemented, and in particular where a third connector is provided for the output of the output data o.

A protocol for the conversion of the appropriate serial test operation mode allows for the possibility to switch off the processor CPU and the possibly existing internal pulse source. By transferring the external clock T into the integrated circuit IC, a direct synchronization preferably takes place of the external data d with. the internally generated clock T*. The internal bus B may be controlled with a shift register, which can be loaded serially. Input data d and the pulse T are provided via the described modulation of the supply voltage VDD.

In an exemplary protocol, a command field is preferably three bits or three pulses long. Internal flags, for example, within the EEPROM, are used to select a system frequency with, for example, 16, 8, 4 or 2 MHz. The input clock T* for several peripheral modules, for instance a LIN-UART-interface, may be produced with the provision of an appropriate clock multiplexer as an additional component of the integrated circuit IC up to the specially generated internal pulse T* of the serial test interface TIF. An analog field for the output of analog signals can for instance be chosen to be 1.25 μs long. If this should not be sufficient the shift pulse may also be stretched in order to prevent a collision with a synchronizing mechanism.

An additional multiplexer at the output connection contact may be programmed to output a serial data stream or other internal analog or digital signals or an internal pulse.

After a reset, the logic of the serial test interface TIF waits until the receipt of a "1". This can for instance be a leading "1" of the reset command. The fourth bit defines the level of the internal reset signal.

According to the above described protocol, various commands may be implemented, especially a reset command, a clock transfer command, a write or read command for the test operation mode or a read or write command for the processor CPU. The above described protocol allows for programming of the processor and/or a modification of memory content of the program memory MP and/or data memory MD, via the test interface TIS.

The invention claimed is:

1. A circuit configuration, comprising
   a serial test interface configured to control a test operation mode,
   a freely programmable digital processor,
   a housing for the accommodation of the test interface and the processor,
   terminals for data or signal exchange or both with external components and equipment, at least one of the terminals is configured to receive a modulated supply voltage having at least three voltage levels modulated therein, the at least three voltage levels including a first voltage level used to supply the circuit configuration with an operating voltage, and at least two voltage levels for the transfer of data and a clock pulse, wherein the at least two voltage levels are controllable, and are different from the first voltage level, and
   a comparator device configured to generate internal data based on an extraction of data modulated on the supply voltage, and to generate an internal clock based on an extraction of a clock modulated on the supply voltage.

2. The circuit configuration according to claim 1, further comprising at least two comparators configured to detect the overshoot or undershoot of the two voltage levels.

3. The circuit configuration according to claim 1, wherein the internal clock is used in a test operation mode by the circuit configuration or components of the circuit configuration.

4. The circuit configuration according to claim 1 further comprising switching equipment for activation of a comparator circuit or the test interface or both only in a test operation mode.

5. The circuit configuration according to claim 4 further comprising a storage facility for storage of basic states for automatic activation of the test operation mode after switching on or start-up or both of the circuit configuration.

6. The circuit configuration according to claim 1, further comprising an analog or digital sensor.

7. The circuit configuration according to claim 6, wherein the analog or digital sensor comprises a Hall sensor.

8. A method for a serial test operation for a circuit configuration, the circuit configuration including a serial test interface configured to control a test operation mode, a freely programmable digital processor, a housing for the accommodation of the test interface and the processor, and terminals for data or signal exchange or both with external components and equipment, at least one of the terminals configured to receive a modulated supply voltage for the transfer of data or a clock pulse or both by using at least two voltage levels which are controllable, and which are different from a supply voltage level that is used to supply the circuit configuration with an operating voltage, the method comprising:
   modulating external data as well as an external clock onto a supply voltage for transfer into the circuit configuration.

9. The method according to claim 8, wherein two voltage levels are used to modulate the data and the clock onto the supply voltage of the circuit configuration.

10. The method according to claim 9, wherein the data and the clock can be modulated onto the supply voltage such that with each second slope of a cycling period of the clock, one of the two voltage levels is exceeded or is not reached, and wherein the intermediate pulse slopes modulate the supply voltage to a level between the two voltage levels.

11. The method according to claim 9, wherein activation of a test operation mode is signaled according to a preset bit sequence.

12. The method according to claim 9, further comprising:
    employing the transferred data to test the circuit configuration.

13. The method according to claim 9, further comprising:
    employing the transferred data to newly program the circuit configuration.

* * * * *